(12) United States Patent
Abou Ghaida et al.

(10) Patent No.: US 8,359,556 B1
(45) Date of Patent: Jan. 22, 2013

(54) RESOLVING DOUBLE PATTERNING CONFLICTS

(75) Inventors: Rani S. Abou Ghaida, Mount Kisco, NY (US); Kanak B. Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/171,530

(22) Filed: Jun. 29, 2011

(51) Int. Cl.
*G06F 17/50* (2006.01)
(52) U.S. Cl. ............... 716/54; 716/50; 716/51; 716/52; 716/53; 716/55
(58) Field of Classification Search ............... 716/50, 716/51, 52, 53, 54, 55
See application file for complete search history.

(56) References Cited

U.S. PATENT DOCUMENTS

| | | |
|---|---|---|
| 2006/0253813 A1* | 11/2006 | Rittman ........................... 716/5 |
| 2008/0189672 A1 | 8/2008 | Shin et al. |
| 2009/0125866 A1 | 5/2009 | Wang et al. |
| 2010/0021055 A1 | 1/2010 | Socha |
| 2011/0003254 A1 | 1/2011 | Chang et al. |
| 2011/0004858 A1 | 1/2011 | Chang et al. |
| 2011/0197168 A1* | 8/2011 | Chen et al. ...................... 716/50 |

OTHER PUBLICATIONS

Chen, Szu-Yu et al., "Native-Conflict-Aware Wire Perturbation for Double Patterning Technology", 2010/IEEE International Conference on Computer-Aided Design (ICCAD), San Jose, California, Nov. 7-11, 2010, pp. 556-561.
Hsu, Chin-Hsiung et al., "Simultaneous Layout migration and Decomposition for Double Patterning Technology", 2009 ACM International Conference on Computer-Aided Design (ICCAD), San Jose, California, Nov. 2-5, 2009, pp. 595-600.
Kahng, Andrew B. et al., "Layout Decomposition for Double Patterning Lithography", ICCAD'08, San Jose, California, Nov. 10-13, 2008, 8 pages.
U.S. Appl. No. 13/223,709.
Chiou, Tsan-Bim et al,, "Development of Layout Split Algorithms and Printability Evaluation for Double Patterning Technology", Proc. of SPIE vol. 6924, 2008, 10 pages.
Drapeau, Martin et al., "Double Patterning Design Split Implementation and Validation for the 32nm Node", Proc. of SPIE vol. 6521, 2007, 15 pages.
Yuan, Kun et al., "Double Patterning Layout Decomposition for Simultaneous Conflict and Stitch Minimization", ISPD '09, Mar. 29-Apr. 1, 2009, ACM, pp. 107-114.

* cited by examiner

*Primary Examiner* — Jack Chiang
*Assistant Examiner* — Brian Ngo
(74) *Attorney, Agent, or Firm* — Stephen R. Tkacs; Stephen J. Walder, Jr.; Eustus O. Nelson (57) ABSTRACT

A mechanism is provided for resolving patterning conflicts. The mechanism performs decomposition with stitches at all candidate locations to find the solution with the minimum number of conflicts. The mechanism then defines interactions between a layout of a first mask and a layout of a second mask through design rules, as well as interactions of mask1/mask2 with top and bottom layers (i.e., contacts, vial, etc.). The mechanism then gives the decomposed layout and design rule definition to any existing design rule fixing or layout compaction tool to solve native conflicts. The modified design rules are that same-layer spacing equals spacing of single patterning, different-layer spacing equals spacing of final layout, and layer overlap equals minimum overlap length.

20 Claims, 7 Drawing Sheets

RESOLVING DOUBLE PATTERNING CONFLICTS

BACKGROUND

The present application relates generally to an improved data processing apparatus and method and more specifically to mechanisms for resolving multiple patterning conflicts.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

Multiple patterning is a class of technologies developed for photolithography to enhance the feature density. The simplest case of multiple patterning is double patterning, where a conventional lithography process is enhanced to produce double the expected number of features. Double exposure is a sequence of two separate exposures of the same photoresist layer using two different photomasks. This technique is commonly used for patterns in the same layer which look very different or have incompatible densities or pitches. In one important case, the two exposures may each consist of lines which are oriented in one or the other of two usually perpendicular directions. This allows the decomposition of two-dimensional patterns into two one-dimensional patterns which are easier to print.

Double pattern lithography (DPL) is an effective technique to improve resolution. DPL theoretically doubles resolution through pitch splitting. DPL involves two separate exposure and etch/freeze steps (litho-etch-litho-etch or litho-freeze-litho-etch). DPL is expected to be needed for 20 nm technology and is one of the best candidate solutions for scaling to 14 nm technology and beyond.

Layout decomposition includes mask assignment, also referred to as graph coloring. In one case, shapes to be formed using photolithography are colored such that two shapes within a predetermined distance are colored differently, meaning they are formed using different photographic masks. Shapes of different masks can overlap. The point at which masks overlap is referred to as a stitch. Stitching is used to resolve a coloring conflict; however, not all conflicts can be resolved by stitching. Some conflicts require layout perturbation or modifications.

In one prior art solution, one may construct a conflict graph, detect odd cycles, and perform wire perturbation. One may repeat this process iteratively until no improvements are possible. Wire perturbation comprises finding all possible perturbations to resolve a conflict and perform trial compaction. This solution has a very long runtime. Also, using this solution, it is impossible to cover all combinations of perturbation. This solution does not consider impact on cross layer constraints like via coverage, etc. A resolution of one conflict may introduce other conflicts. In addition, this solution only works with a single spacing rule and cannot be used with shape-dependent design rules.

In another prior art solution, one may pre-compute all wire-spacing options that reduces conflicts. This solution formulates coloring problem as integer linear programming (ILP) to minimize candidate wire-spreading options. This solution is very slow. This solution is limited to wire-spreading, and spreading may cause new conflicts at other places.

Another solution uses split level design for double pattern lithography. The solution specifies a DPL layer as two layers. For example, a metal layer, M1, is specified to the designer as M1$a$ and M1$b$ corresponding to two exposures of DPL. The designer must then consider inter- and intra-level ground rules to ensure DPL compatibility during design. This solution exposes the designer to DPL such that the designer must ensure the design satisfies extra design rules for DPL compatibility.

The prior art solutions present trade-offs between "correct-by-construction" and "layout legalization" approaches. Correct-by-construction exposes designers to DPL complexity. Layout legalization flows are runtime intensive and suffer from the issue that resolution of one conflict may create other conflicts. A conflict removal flow should shield designers from DPL complexity and provide efficient flow that detects and fixes conflicts once and for all simultaneously across all layers.

SUMMARY

In one illustrative embodiment, a method, in a data processing system, is provided for multiple patterning conflict resolution. The method comprises receiving a design layout for an integrated circuit and performing decomposition to form a first mask and a second mask with all possible stitch locations. The first mask and the second mask have coloring conflicts such that at least one shape in the first mask or the second mask is too close to another shape in the same mask. The method further comprises defining interactions between the first mask and the second mask using a set of split level design rules and fixing native conflicts in the first mask and the second mask by modifying at least one shape in the first mask or the second mask subject to the set of split level design rules to form a final layout.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide a mechanism for resolving patterning conflicts. The mechanism performs decomposition with stitches at all candidate locations to find the solution with the minimum number of conflicts. The method works with any initial decomposition, e.g., coloring, solution. The mechanism then defines interactions between the layout of a first mask and a layout of a second mask through design rules. The mechanism then gives the decomposed layout and design rule definition to any existing design rule fixing or layout compaction tool to solve native conflicts. The modified design rules are that same-layer spacing equals spacing of single patterning, different-layer spacing equals spacing of final layout, and layer overlap equals minimum overlap length.

Figure 1:
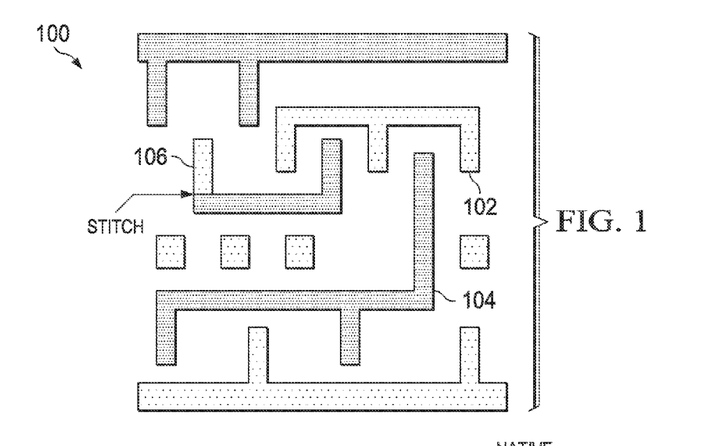
FIG. 1 is a diagram illustrating an example layout of wires to be formed using photolithography with which aspects of the illustrative embodiments may be implemented.

FIG. 1 is a diagram illustrating an example layout of wires to be formed using photolithography with which aspects of the illustrative embodiments may be implemented. Layout 100 comprises a plurality of two dimensional shapes of wires to be formed using double pattern lithography. As seen in FIG. 1, shape 102 is formed using a first mask (first color) and shape 104 is formed using a second mask (second color). In this example, according to the goal of the embodiments described herein, all shapes can be formed using two photolithographic masks. No two shapes of the same color are within a predetermined distance of one another. As seen in this example, shape 106 is formed using both the first mask and the second mask with a stitch where the masks overlap.

Mask assignment may be referred to as a "graph coloring problem," meaning the problem of coloring the shapes such that no two shapes of the same color are within a predetermined distance of one another. Stitching may be used to resolve a coloring conflict. However, not all conflicts can be resolved by stitching.

Figure 2A:
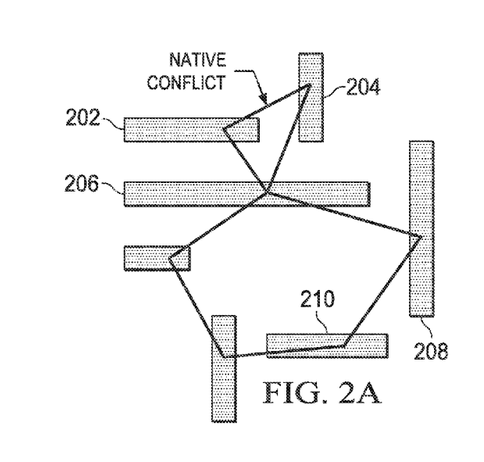
FIGS. 2A and 2B illustrate an example design with stitching and native conflicts for which aspects of the illustrative embodiments may be implemented.
Figure 2B:
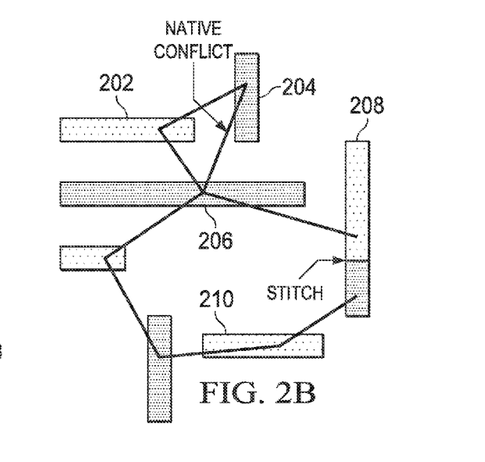

FIGS. 2A and 2B illustrate an example design with stitching and native conflicts for which aspects of the illustrative embodiments may be implemented. As seen in FIG. 2A, shapes 202, 204, 206, and 208 are too close to each other, referred to as native conflicts. FIG. 2B illustrates a solution with double pattern lithography. As seen in FIG. 2B, shape 202 and shape 206 are colored differently, thus resolving the conflict. Also, shape 208 is formed using two different masks with a stitch, thus resolving conflicts between shapes 206 and 208 and between shapes 208 and 210.

However, as shown in FIG. 2B, the conflict between shapes 204 and 206 cannot be resolved. No matter how shapes 202, 204, and 206 are colored, there will always be an unresolved conflict with double pattern lithography (DPL).

In accordance with the illustrative embodiments described herein, a mechanism is provided that uses split level design rules to fix native conflicts simultaneously across multiple layers without creating new conflicts. The mechanism allows designers to design the original layout with conventional design rules, thus shielding the designer from DPL complexity.

The mechanism uses linear programming formulation for conflict resolution with minimum layout perturbation. The mechanism generates an initial decomposition solution for DPL layers. The mechanism models the layout as a constraint graph. A vertex represents an edge in the layout, and arcs represent decomposition and ground rule constraints between layout edges. The mechanism treats DPL layers as stand-alone single-patterning layers.

The mechanism attempts to fix conflicts "once for all" with minimum perturbation while maintaining all inter- and intra-level connectivity, which may be represented as follows:

Minimize $$\sum_{V_i \in V} \|\hat{L}_i - L_i\|,$$

where L are drawn locations of layout edges and $\hat{L}$ are modified locations of layout edges, subject to:

$$\hat{L}_i - \hat{L}_j \geq S_{ij} \; \forall A_{ij} \in A,$$

which represents the DPL split level and ground rule constraints.

The mechanism performs decomposition with all possible stitch locations. This decomposition must have a minimum number of native conflicts. The mechanism can be used with any initial decomposition solution but it is better to start with the minimum number of native conflicts if possible. The mechanism performs decomposition by finding all possible stitch locations, assigning conflicting parts to the first and second masks, and reconstructing parts to the first and second mask. The mechanism finds all possible stitch location by performing design rule dependent projection, finding regions that do not conflict with any other feature, and stitching at non-conflicting parts that separate two conflicting parts. The mechanism assigns the conflicting parts to the first and second masks with a first objective of minimizing conflicts and a second objective of minimizing the number of stitches by trying to assign the two sides of a stitch to the same mask. The mechanism reconstructs by performing mask assignment of non-conflicting parts. Any existing decomposition flows that minimize native conflicts may also be used.

Figure 3:
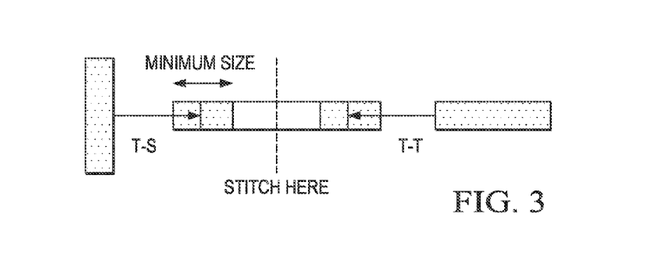
FIG. 3 illustrates finding a stitch location in accordance with the illustrative embodiment.

FIG. 3 illustrates finding a stitch location in accordance with the illustrative embodiment. The minimum size is the minimum size an isolated feature must have to be printable. The values t-s and t-t represent the line-end (a.k.a. tip) to line-side minimum spacing requirement and the line-end to line-side spacing requirement that the layout must obey to be printable.

The mechanism then defines interactions between the layout of the first mask and the layout of the second mask through split level design rules. The mechanism marks redundancy and extra input/output pads to possibly sacrifice them to resolve conflicts.

The mechanism then fixes native conflicts by modifying layout subject to split level design rules. This can be achieved by giving decomposed layout and split level design rule definitions to an automated design rule fixing or layout migration tool. The modified split design rules comprise a rule stating that same-layer spacing equals spacing of single patterning, a rule stating that different-layer spacing equals spacing of final layout, a rule stating that layer overlap equals a minimum overlap length, and recommended rules for sacrificial parts.

Figure 4A:
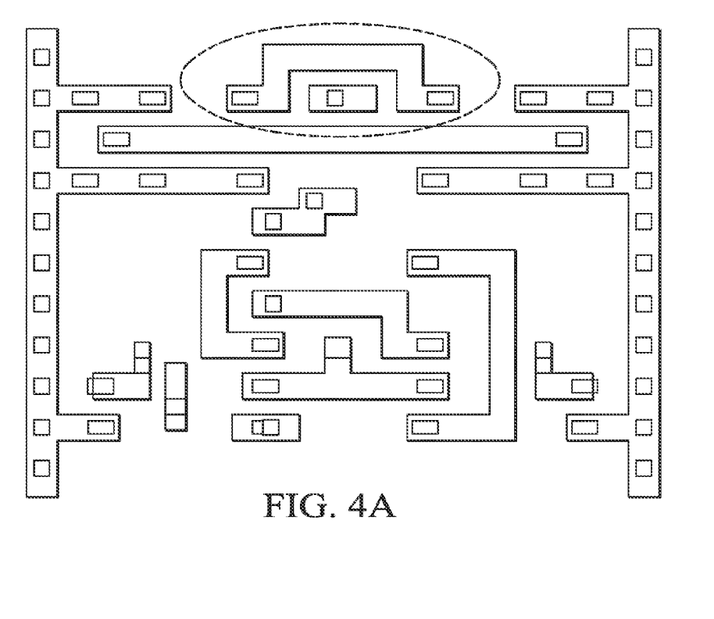
FIGS. 4A and 4B illustrate correction of native coloring conflicts in accordance with an example embodiment.
Figure 4B:
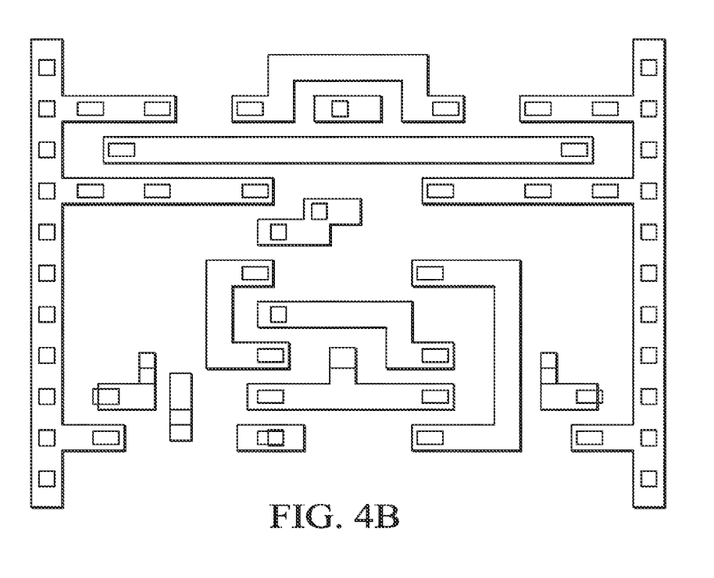

FIGS. 4A and 4B illustrate correction of native coloring conflicts in accordance with an example embodiment. FIG. 4A shows an original layout. As seen in FIG. 4A, the layout includes features with a native conflict that cannot be resolved with a stitch. In accordance with the illustrative embodiment, a mechanism fixes native conflicts by modifying the layout subject to split level design rules. In this case, as shown in FIG. 4B, the mechanism shifts one or more shapes in the design to fix the conflict with minimum perturbation. That is, the mechanism modifies the layout subject to the split level design rules while making the fewest modifications possible.

Figure 5A:
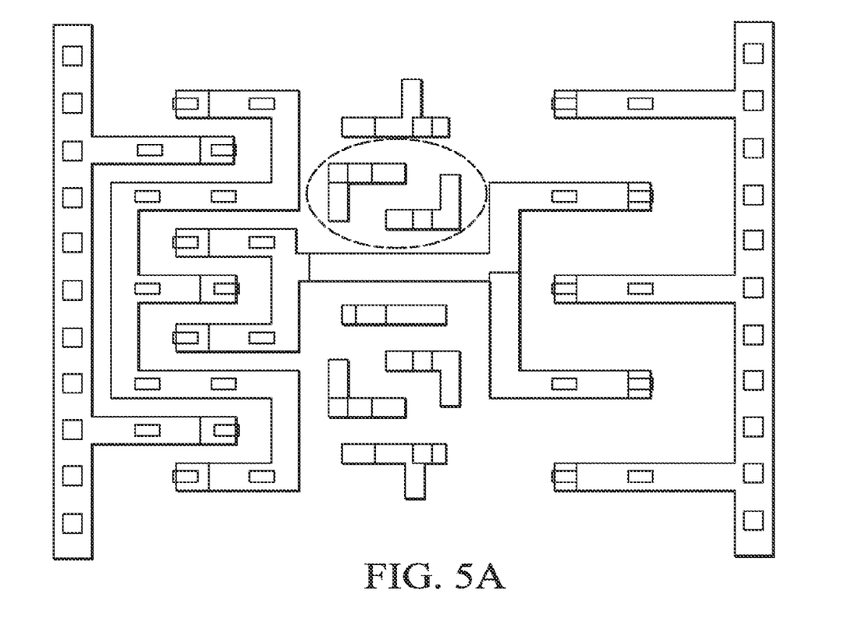
FIGS. 5A and 5B illustrate correction of native coloring conflicts with the same area in accordance with an example embodiment.
Figure 5B:
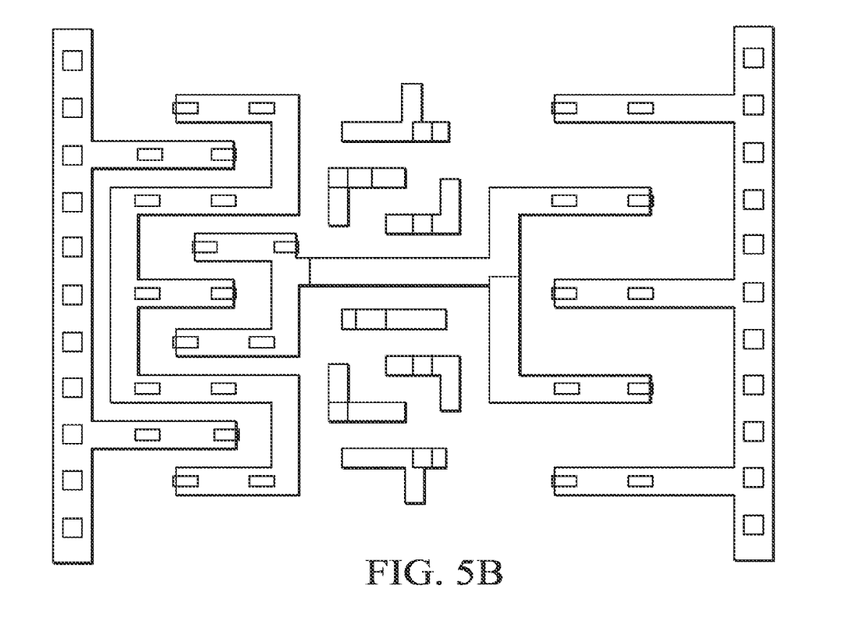

FIGS. 5A and 5B illustrate correction of native coloring conflicts with the same area in accordance with an example embodiment. FIG. 5A shows an original layout. As seen in FIG. 5A, the layout includes features with a native conflict that cannot be resolved with a stitch. In accordance with the illustrative embodiment, a mechanism fixes native conflicts by modifying the layout subject to split level design rules. In this case, as shown in FIG. 5B, the mechanism modifies one or more shapes in the design to fix the conflict such that the modified design uses the same area.

Figure 6A:
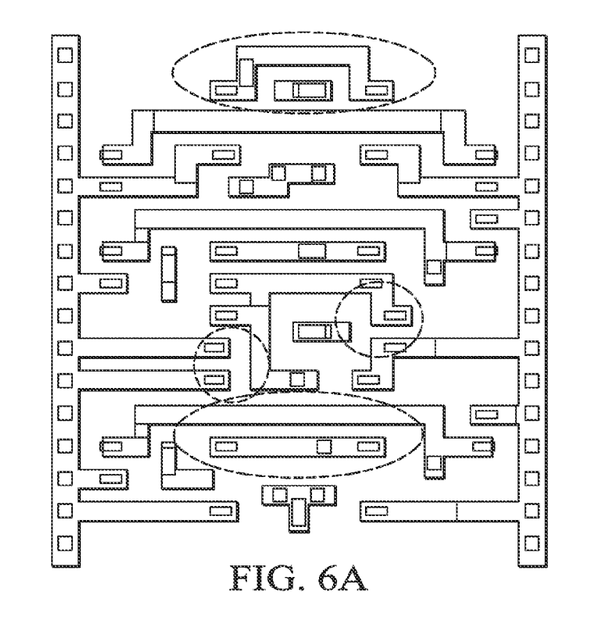
FIGS. 6A-6C illustrate another example of correction of native coloring conflicts in accordance with an example embodiment.
Figure 6B:
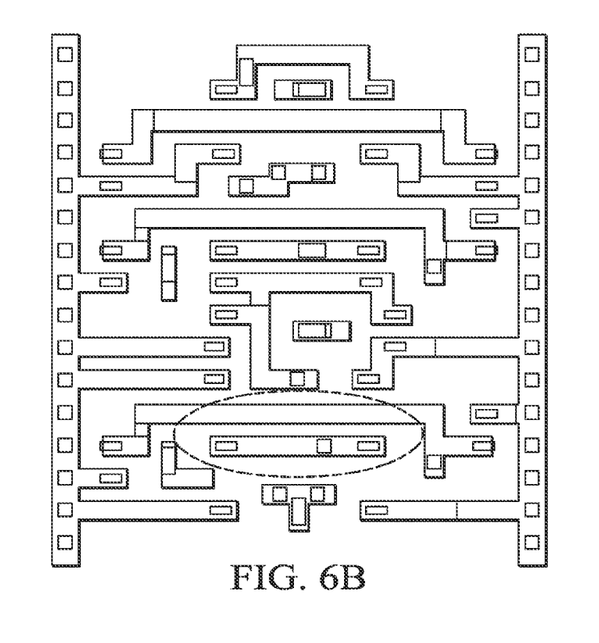
Figure 6C:
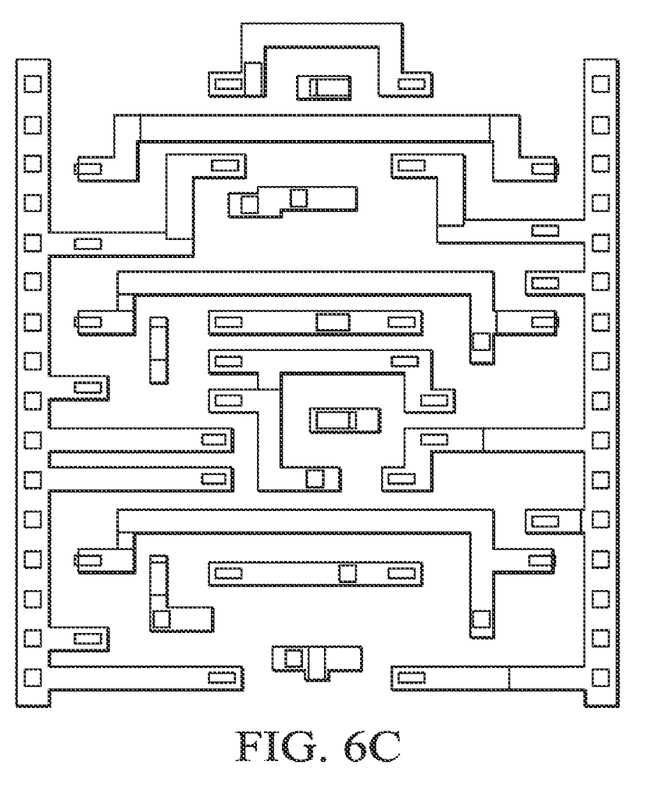

FIGS. 6A-6C illustrate another example of correction of native coloring conflicts in accordance with an example embodiment. FIG. 6A shows an original layout having four coloring conflicts. In accordance with the illustrative embodiment, a mechanism attempts to fix the conflicts by modifying the layout subject to split level design rules. In this case, however, as shown in FIG. 6B, the mechanism is able to fix three of the four conflicts using the same design area. As seen in FIG. 6C, the mechanism is then able to fix the remaining conflict with an area increase. In accordance with the illustrative embodiments, the mechanism attempts to fix the remaining conflict subject to split level design rules with the minimum possible area increase.

Figure 7A:
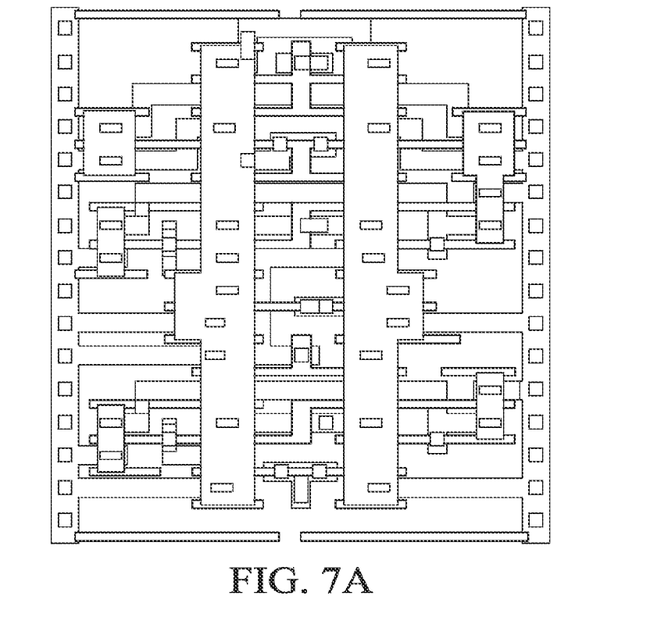
FIGS. 7A and 7B illustrate correction of native coloring conflicts in accordance with an example embodiment.
Figure 7B:
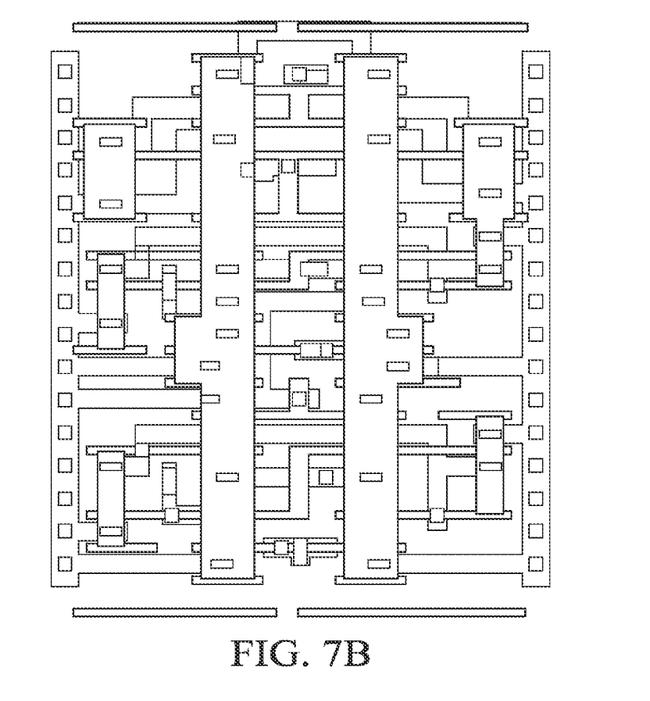

FIGS. 7A and 7B illustrate correction of native coloring conflicts in accordance with an example embodiment. FIG. 7A shows an original layout having coloring conflicts. FIG. 7B shows a final layout with conflicts resolved with increased area and removal of redundant I/O pads.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 8:
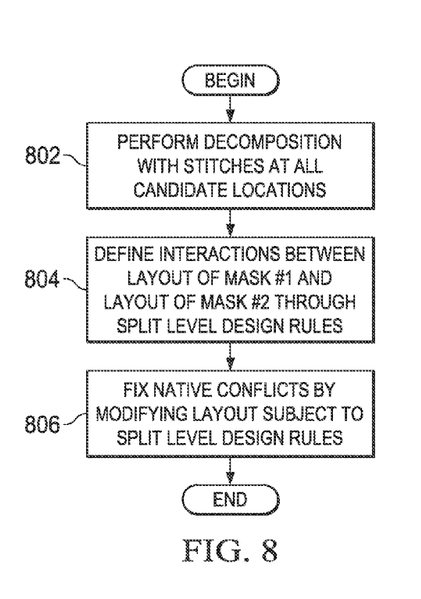
FIG. 8 is a flowchart illustrating overall conflict resolution flow in accordance with an illustrated embodiment.

FIG. 8 is a flowchart illustrating overall conflict resolution flow in accordance with an illustrated embodiment. Operation begins, and a conflict resolution mechanism performs decomposition with all possible stitch locations (block 802). The mechanism then defines interactions between the layout of a first mask and the layout of a second mask through split level design rules (block 804), as well as interactions of mask1/mask2 with top and bottom layers (i.e, contacts, vial, etc.). As part of defining interactions between the first mask and the second mask, the mechanism may mark redundancy and extra I/O pads to possibly sacrifice them to resolve conflicts.

Then, the mechanism fixes native conflicts by modifying the layout subject to the split level design rules (block 806). The mechanism may be achieved by giving decomposed layout and split level design rule definition to an automated design rule fixing or layout migration tool. The modified split design rules comprise a rule stating that same-layer spacing equals spacing of single patterning, a rule stating that different-layer spacing equals spacing of final layout, a rule stating that layer overlap equals a minimum overlap length, and recommended rules for sacrificial parts. Thereafter, operation ends.

Figure 9:
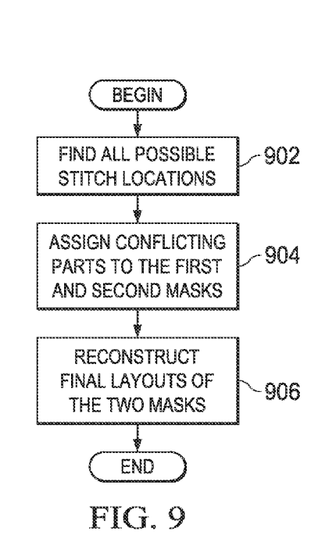
FIG. 9 is a flowchart illustrating operation of a mechanism for performing decomposition with all possible stitch locations in accordance with an illustrative embodiment.

FIG. 9 is a flowchart illustrating operation of a mechanism for performing decomposition with all possible stitch locations in accordance with an illustrative embodiment. Operation begins, and the mechanism finds all possible stitch locations (block 902). The mechanism may find all possible stitch locations by performing design rule dependent projections, finding regions that do not conflict with other features, and stitching at non-conflicting parts that separate two conflicting parts. The mechanism then assigns conflicting parts to the first mask and the second mask (block 904). The mechanism may assign conflicting parts with the objectives of minimizing conflicts and minimizing the number of stitches by trying to assign the two sides of a stitch to the same mask. Then, the mechanism reconstructs final layouts of the two masks (block 906). The mechanism may mask assignment of non-conflicting parts in the final layouts of the two masks. Thereafter, the operation ends. Any existing decomposition flows that preferably minimize conflicts that minimize native conflicts may also be used.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 10:
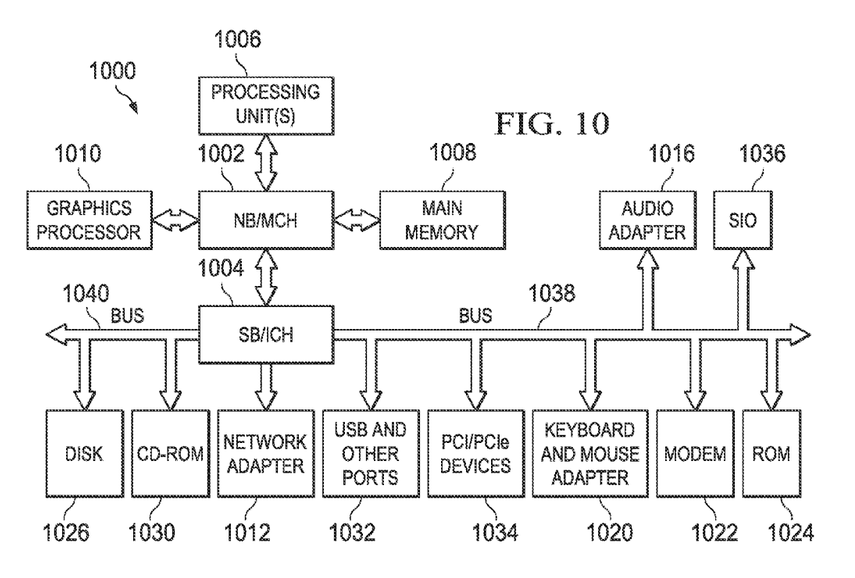
FIG. 10 is a block diagram of an example data processing system in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIG. 10 is provided hereafter as an example environment in which aspects of the illustrative embodiments may be implemented. It should be appreciated that FIG. 10 is only an example and is not intended to assert or imply any limitation with regard to the environments in which aspects or embodiments of the present invention may be implemented. Many modifications to the depicted environment may be made without departing from the spirit and scope of the present invention.

FIG. 10 is a block diagram of an example data processing system in which aspects of the illustrative embodiments may be implemented. Data processing system 1000 is an example of a computer in which computer usable code or instructions implementing the processes for illustrative embodiments of the present invention may be located.

In the depicted example, data processing system 1000 employs a hub architecture including north bridge and memory controller hub (NB/MCH) 1002 and south bridge and input/output (I/O) controller hub (SB/ICH) 1004. Processing unit 1006, main memory 1008, and graphics processor 1010 are connected to NB/MCH 1002. Graphics processor 1010 may be connected to NB/MCH 1002 through an accelerated graphics port (AGP).

In the depicted example, local area network (LAN) adapter 1012 connects to SB/ICH 1004. Audio adapter 1016, keyboard and mouse adapter 1020, modem 1022, read only memory (ROM) 1024, hard disk drive (HDD) 1026, CD-ROM drive 1030, universal serial bus (USB) ports and other communication ports 1032, and PCI/PCIe devices 1034 connect to SB/ICH 1004 through bus 1038 and bus 1040. PCI/PCIe devices may include, for example, Ethernet adapters, add-in cards, and PC cards for notebook computers. PCI uses a card bus controller, while PCIe does not. ROM 1024 may be, for example, a flash basic input/output system (BIOS).

HDD 1026 and CD-ROM drive 1030 connect to SB/ICH 1004 through bus 1040. HDD 1026 and CD-ROM drive 1030 may use, for example, an integrated drive electronics (IDE) or serial advanced technology attachment (SATA) interface. Super I/O(SIO) device 1036 may be connected to SB/ICH 1004.

An operating system runs on processing unit 1006. The operating system coordinates and provides control of various components within the data processing system 1000 in FIG. 10. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 1000 (Java is a trademark of Oracle and/or its affiliates.).

As a server, data processing system 1000 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 1000 may be a symmetric multiprocessor (SMP) system including a plurality of processors in processing unit 1006. Alternatively, a single processor system may be employed.

Instructions for the operating system, the object-oriented programming system, and applications or programs are located on storage devices, such as HDD 1026, and may be loaded into main memory 1008 for execution by processing unit 1006. The processes for illustrative embodiments of the present invention may be performed by processing unit 1006 using computer usable program code, which may be located in a memory such as, for example, main memory 1008, ROM 1024, or in one or more peripheral devices 1026 and 1030, for example.

A bus system, such as bus 1038 or bus 1040 as shown in FIG. 10, may be comprised of one or more buses. Of course, the bus system may be implemented using any type of communication fabric or architecture that provides for a transfer of data between different components or devices attached to the fabric or architecture. A communication unit, such as modem 1022 or network adapter 1012 of FIG. 10, may include one or more devices used to transmit and receive data. A memory may be, for example, main memory 1008, ROM 1024, or a cache such as found in NB/MCH 1002 in FIG. 10.

Those of ordinary skill in the art will appreciate that the hardware in FIG. 10 may vary depending on the implementation. Other internal hardware or peripheral devices, such as flash memory, equivalent non-volatile memory, or optical disk drives and the like, may be used in addition to or in place of the hardware depicted in FIG. 10. Also, the processes of the illustrative embodiments may be applied to a multiprocessor data processing system, other than the SMP system mentioned previously, without departing from the spirit and scope of the present invention.

Moreover, the data processing system 1000 may take the form of any of a number of different data processing systems including client computing devices, server computing devices, a tablet computer, laptop computer, telephone or other communication device, a personal digital assistant (PDA), or the like. In some illustrative examples, data processing system 1000 may be a portable computing device which is configured with flash memory to provide non-volatile memory for storing operating system files and/or user-generated data, for example. Essentially, data processing system 1000 may be any known or later developed data processing system without architectural limitation.

Thus, the illustrative embodiments provide mechanisms for resolving patterning conflicts. The mechanism performs decomposition with stitches at all candidate locations to find the solution with the minimum number of conflicts. The mechanism then defines interactions between the layout of a first mask and a layout of a second mask through design rules. The mechanism then gives the decomposed layout and design rule definition to any existing design rule fixing or layout compaction tool to solve native conflicts. The modified design rules are that same-layer spacing equals spacing of single patterning, different-layer spacing equals spacing of final layout, and layer overlap equals minimum overlap length.

The illustrative embodiments provide a non-iterative double patterning lithography (DPL) conflict removal flow that simultaneously fixes conflicts once for all. The illustrative embodiments provide the ability to sacrifice redundancy for conflict removal. The illustrative embodiments also mask DPL complexity from designers. The mechanism of the illustrative embodiments provides full computer aided design (CAD) flow for enablement of double patterning needed at 20 nm and beyond. The illustrative embodiments address a key need for double patterning enablement while maintaining design efficiency and designer productivity. In addition, the illustrative embodiments may exploit existing layout migration tools to enable automated conflict removal.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for multiple patterning conflict resolution, the method comprising:
   receiving, by the data processing system, a design layout for an integrated circuit;
   performing, by the data processing system, decomposition to form at least a first mask and a second mask with stitch locations, wherein the first mask and the second mask have coloring conflicts such that at least one shape in the first mask or the second mask is too close to another shape in the same mask;
   defining, by the data processing system, interactions between the first mask and the second mask using a set of split level design rules, wherein the set of split level design rules comprises a rule stating that same-layer spacing equals spacing of single patterning, a rule stating that different-layer spacing equals spacing of a final layout, a rule stating that layer overlap equals a minimum overlap length, and recommendation rules for sacrificial parts; and automatically fixing, by the data processing system, native conflicts in the first mask and the second mask by modifying at least one shape in the first mask or the second mask subject to the set of split level design rules to form the final layout.

2. The method of claim 1, wherein performing decomposition comprises:
finding all possible stitch locations;
assigning conflicting parts to the first mask and the second mask; and
reconstructing final layouts of the first mask and the second mask.

3. The method of claim 2, wherein finding all possible stitch locations comprises:
performing design rule dependent projections;
finding regions that do not conflict with any other feature; and
stitching at non-conflicting parts that separate two conflicting parts.

4. The method of claim 2, wherein assigning conflicting parts to the first mask and the second mask comprises assigning conflicting parts such that the final layouts of the first mask and the second mask have a minimum number of conflicts.

5. The method of claim 2, wherein assigning conflicting parts to the first mask and the second mask comprises assigning conflicting parts such that the final layouts of the first mask and the second mask have a minimum number of stitches by attempting to assign two sides of a given stitch to the same mask.

6. The method of claim 1, wherein defining interactions between the first mask and the second mask comprises marking redundancy and extra input/output pads for removal.

7. The method of claim 1, wherein fixing native conflicts comprises providing the decomposed layout and the set of split level design rules to an automated design rule fixing or layout migration tool.

8. A computer program product comprising a computer readable storage medium having a computer readable program stored therein, wherein the computer readable program, when executed on a computing device, causes the computing device to:
receive a design layout for an integrated circuit;
perform decomposition to form at least a first mask and a second mask with stitch locations, wherein the first mask and the second mask having coloring conflicts such that at least one shape in the first mask or the second mask is too close to another shape in the same mask;
define interactions between the first mask and the second mask using a set of split level design rules, wherein the set of split level design rules comprises a rule stating that same-layer spacing equals spacing of single patterning, a rule stating that different-layer spacing equals spacing of a final layout, a rule stating that layer overlap equals a minimum overlap length, and recommendation rules for sacrificial parts; and
automatically fix native conflicts in the first mask and the second mask by modifying at least one shape in the first mask or the second mask subject to the set of split level design rules to form the final layout.

9. The computer program product of claim 8, wherein performing decomposition comprises:
finding all possible stitch locations;
assigning conflicting parts to the first mask and the second mask; and
reconstructing final layouts of the first mask and the second mask.

10. The computer program product of claim 9, wherein finding all possible stitch locations comprises:
performing design rule dependent projections;
finding regions that do not conflict with any other feature; and
stitching at non-conflicting parts that separate two conflicting parts.

11. The computer program product of claim 9, wherein assigning conflicting parts to the first mask and the second mask comprises assigning conflicting parts such that the final layouts of the first mask and the second mask have a minimum number of conflicts.

12. The computer program product of claim 9, wherein assigning conflicting parts of the first mask and the second mask comprises assigning conflicting parts such that the final layouts of the first mask and the second mask have a minimum number of stitches by attempting to assign two sides of a given stitch to the same mask.

13. The computer program product of claim 8, wherein defining interactions between the first mask and the second mask comprises marking redundancy and extra input/output pads for removal.

14. The computer program product of claim 8, wherein fixing native conflicts comprises providing the decomposed layout and the set of split level design rules to an automated design rule fixing or layout migration tool.

15. The computer program product of claim 8, wherein the computer readable program is stored in a computer readable storage medium in a data processing system and wherein the computer readable program was downloaded over a network from a remote data processing system.

16. The computer program product of claim 8, wherein the computer readable program is stored in a computer readable storage medium in a server data processing system and wherein the computer readable program is downloaded over a network to a remote data processing system for use in a computer readable storage medium with the remote system.

17. An apparatus, comprising:
a processor; and
a memory coupled to the processor, wherein the memory comprises instructions which, when executed by the processor, cause the processor to:
receive a design layout for an integrated circuit;
perform decomposition to form at least a first mask and a second mask with stitch locations, wherein the first mask and the second mask have coloring conflicts such that at least one shape in the first mask or the second mask is too close to another shape in the same mask;
define interactions between the first mask and the second mask using a set of split level design rules, wherein the set of split level design rules comprises a rule stating that same-layer spacing equals spacing of single patterning, a rule stating that different-layer spacing equals spacing of a final layout, a rule stating that layer overlap equals a minimum overlap length, and recommendation rules for sacrificial parts; and
automatically fix native conflicts in the first mask and the second mask by modifying at least one shape in the first mask or the second mask subject to the set of split level design rules to form the final layout.

18. The apparatus of claim 17, wherein performing decomposition comprises:
finding all possible stitch locations;
assigning conflicting parts to the first mask and the second mask; and
reconstructing final layouts of the first mask and the second mask.

19. The apparatus of claim 17, wherein defining interactions between the first mask and the second mask comprises marking redundancy and extra input/output pads for removal.

20. The apparatus of claim 17, wherein fixing native conflicts comprises providing the decomposed layout and the set of split level design rules to an automated design rule fixing or layout migration tool.

* * * * *